(12) United States Patent
Wei

(10) Patent No.: US 12,354,970 B2
(45) Date of Patent: Jul. 8, 2025

(54) SEMICONDUCTOR DEVICE STRUCTURE WITH OVERLAY MARK

(71) Applicant: NANYA TECHNOLOGY CORPORATION, New Taipei (TW)

(72) Inventor: Chun-Yen Wei, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 495 days.

(21) Appl. No.: 17/716,112

(22) Filed: Apr. 8, 2022

(65) Prior Publication Data
US 2023/0326868 A1 Oct. 12, 2023

(51) Int. Cl.
*H01L 23/544* (2006.01)
*H10H 20/851* (2025.01)

(52) U.S. Cl.
CPC ....... *H01L 23/544* (2013.01); *H10H 20/8516* (2025.01); *H01L 2223/54426* (2013.01); *H01L 2223/54433* (2013.01)

(58) Field of Classification Search
CPC ......... H01L 33/508; H01L 2223/54426; H01L 2223/54433; H01L 2223/5444; H01L 2223/5442; H01L 22/30; H01L 23/544; H10L 23/544; H10H 20/0361; H10H 20/8512; H10H 20/8513; H10H 20/8514; H10H 20/8515; H10H 20/8516; G03F 7/70683; G03F 7/70633
See application file for complete search history.

(56) References Cited

U.S. PATENT DOCUMENTS

| 2005/0161836 A1 | 7/2005 | Yudasaka et al. |
| 2014/0192333 A1 | 7/2014 | Sewell et al. |
| 2021/0382402 A1 | 12/2021 | Ma et al. |
| 2022/0013468 A1 | 1/2022 | Volkovich et al. |
| 2022/0052078 A1* | 2/2022 | Kim ....................... H01L 25/162 |

FOREIGN PATENT DOCUMENTS

| CN | 113161277 A | 7/2021 |
| EP | 2602663 A1 | 6/2013 |
| JP | 2019091094 A | 6/2019 |
| TW | 201935148 A | 9/2019 |
| TW | 202004842 A | 1/2020 |
| TW | 202119123 A | 5/2021 |

OTHER PUBLICATIONS

Office Action dated on Jan. 9, 2023 related to Taiwanese Application No. 111122238.
Office Action dated on Jan. 13, 2023 related to Taiwanese Application No. 111122236.
Office Action and Search Report dated on Oct. 3US1, 2024 related to U.S. Appl. No. 17/716,374.

* cited by examiner

*Primary Examiner* — Latanya N Crawford Eason
(74) *Attorney, Agent, or Firm* — Xuan Zhang

(57) ABSTRACT

A semiconductor device structure with overlay marks is provided. The semiconductor device structure includes a substrate, a first light-emitting feature, a first pattern and a second pattern. The first light-emitting feature is disposed on the substrate. The first pattern is disposed on the first light-emitting feature. The second pattern is disposed on the first pattern. The first light-emitting feature is configured to emit a light of a first wavelength. The first pattern has a first transmittance to the light of the first wavelength. The second pattern has a second transmittance to the light of the first wavelength. The first transmittance is different from the second transmittance.

16 Claims, 15 Drawing Sheets

SEMICONDUCTOR DEVICE STRUCTURE WITH OVERLAY MARK

TECHNICAL FIELD

The present disclosure relates to a semiconductor device structure, and more particularly, to a semiconductor device structure including an overlay mark structure.

DISCUSSION OF THE BACKGROUND

As the semiconductor industry develops, reducing overlay errors in photoresist patterns and underlying patterns in lithography operations is becoming much more important. Since correctly measuring overlay errors has become more difficult due to various factors such as unclear of optical images between a current layer and a pre-layer of an overlay mark structure, a new semiconductor device structure and method which can more precisely measure overlay errors are developed.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a first light-emitting feature, a first pattern and a second pattern. The first light-emitting feature is disposed on the substrate. The first pattern is disposed on the first light-emitting feature. The second pattern is disposed on the first pattern. The first light-emitting feature is configured to emit a light of a first wavelength. The first pattern has a first transmittance to the light of the first wavelength. The second pattern has a second transmittance to the light of the first wavelength. The first transmittance is different from the second transmittance.

Another aspect of the present disclosure provides a semiconductor device structure. The semiconductor device structure includes a substrate, a first light-emitting feature, and an overlay mark structure. The first light-emitting feature is disposed on the substrate. The first light-emitting feature includes metal ions utilized to emit a fluorescence with a first wavelength. The overlay mark structure is disposed on the first light-emitting feature. The overlay mark structure is configured to absorb and/or reflect a fluorescence emitted from the first light-emitting feature.

Another aspect of the present disclosure provides a method for manufacturing a semiconductor device structure. The method includes: providing a substrate; forming a first light-emitting feature on the substrate; forming a first pattern on the first light-emitting feature; and forming a second pattern on the first pattern, wherein the first light-emitting feature is configured to emit a light of a first wavelength, and the first pattern has a first transmittance to the light of the first wavelength, the second pattern has a second transmittance to the light of the first wavelength, and the first transmittance is different from the second transmittance.

The embodiments of the present disclosure provide a semiconductor device structure including a light-emitting feature. The light emitting feature can be configured to emit fluorescence. The fluorescence can improve the contrast between a current layer and a pre-layer of an overlay mark structure in an optical image. Thus, the overlay error can be calculated more accurately based on the aforesaid optical image.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers Referring to similar elements throughout the Figures, and:

DETAILED DESCRIPTION

Figure 1:
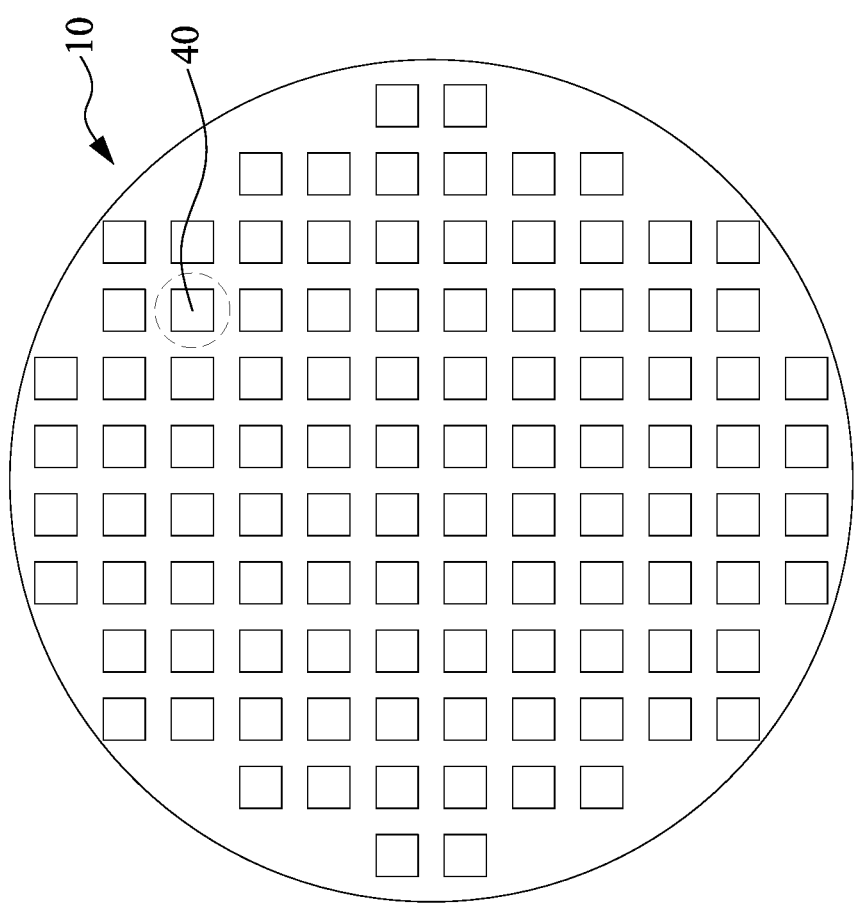
FIG. 1 is a top view of a wafer, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
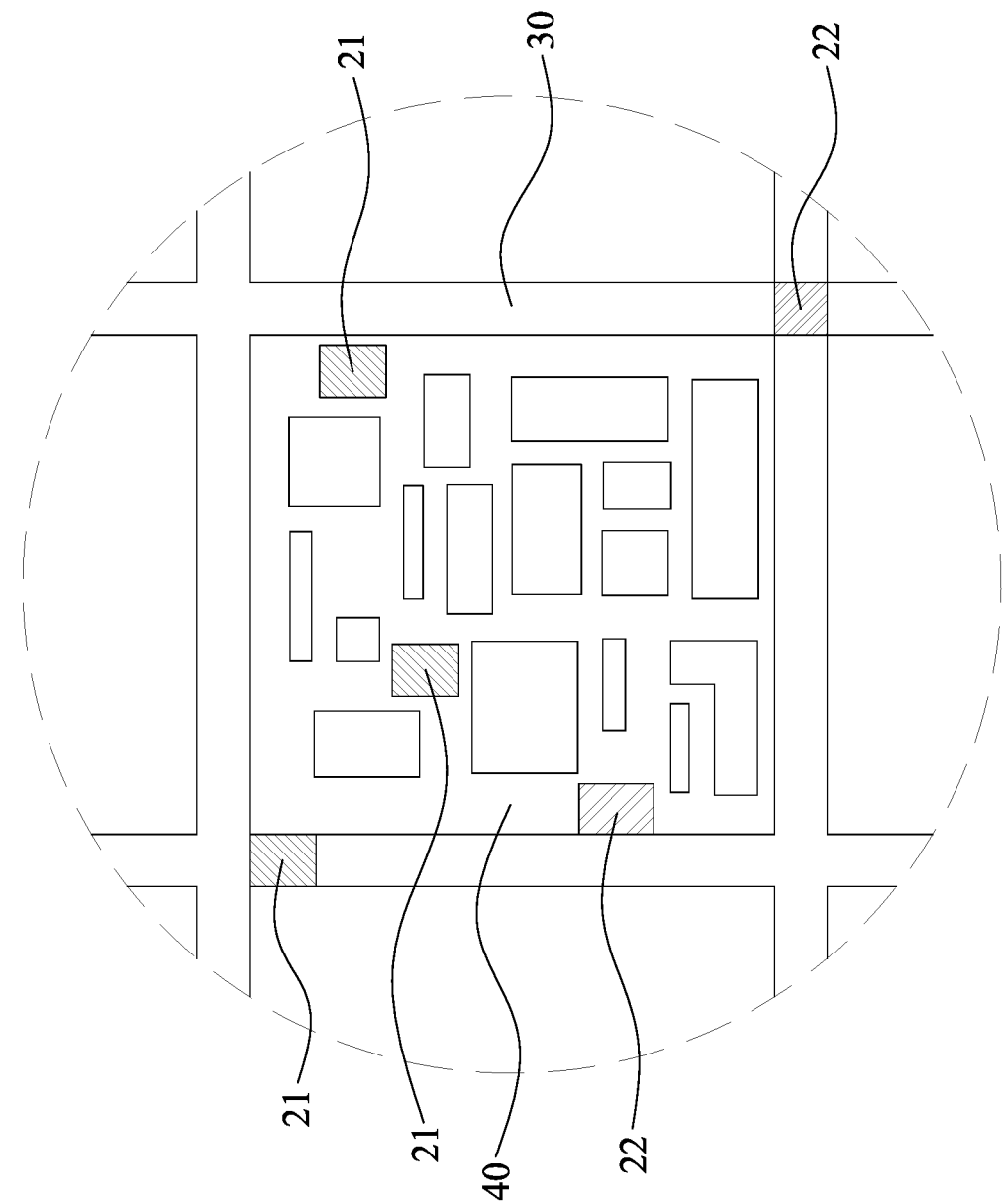
FIG. 2 is an enlargement view of a dotted region as shown in FIG. 1, in accordance with some embodiments of the present disclosure.

Referring to FIG. 1 and FIG. 2, FIG. 1 is a top view of a wafer 10 according to various aspects of the present disclosure, and FIG. 2 is a top view of the enlargement of a dotted region in FIG. 1.

As shown in FIG. 1 and FIG. 2, the wafer 10 is sawed along scribe lines 30 into a plurality of dies 40. Each of the dies 40 may include semiconductor devices, which can include active components and/or passive components. The active component may include a memory die (e.g., dynamic random access memory (DRAM) die, a static random access memory (SRAM) die, etc.), a power management die (e.g., power management integrated circuit (PMIC) die), a logic die (e.g., system-on-a-chip (SoC), central processing unit (CPU), graphics processing unit (GPU), application processor (AP), microcontroller, etc.), a radio frequency (RF) die, a sensor die, a micro-electro-mechanical-system (MEMS) die, a signal processing die (e.g., digital signal processing (DSP) die), a front-end die (e.g., analog front-end (AFE) dies) or other active components. The passive component may include a capacitor, a resistor, an inductor, a fuse or other passive components.

As shown in FIG. 2, overlay mark structures 21 and 22 can be disposed on the wafer 10. In some embodiments, the overlay mark structure 21 or 22 can be located on the scribe lines 30. The overlay mark structure 21 or 22 can be disposed at the corner of an edge of each of the dies 40. In some embodiments, the overlay mark structure 21 or 22 can be located inside the die 40. In some embodiments, the overlay mark structure 21 can be utilized to measure whether the current layer, such as an opening of a photoresist layer, is precisely aligned with a pre-layer in the semiconductor fabrication process. In some embodiments, the overlay mark structure 21 or 22 can be utilized to generate an overlay error between a current layer (or an upper layer) and a pre-layer (or a lower layer).

Figure 3:
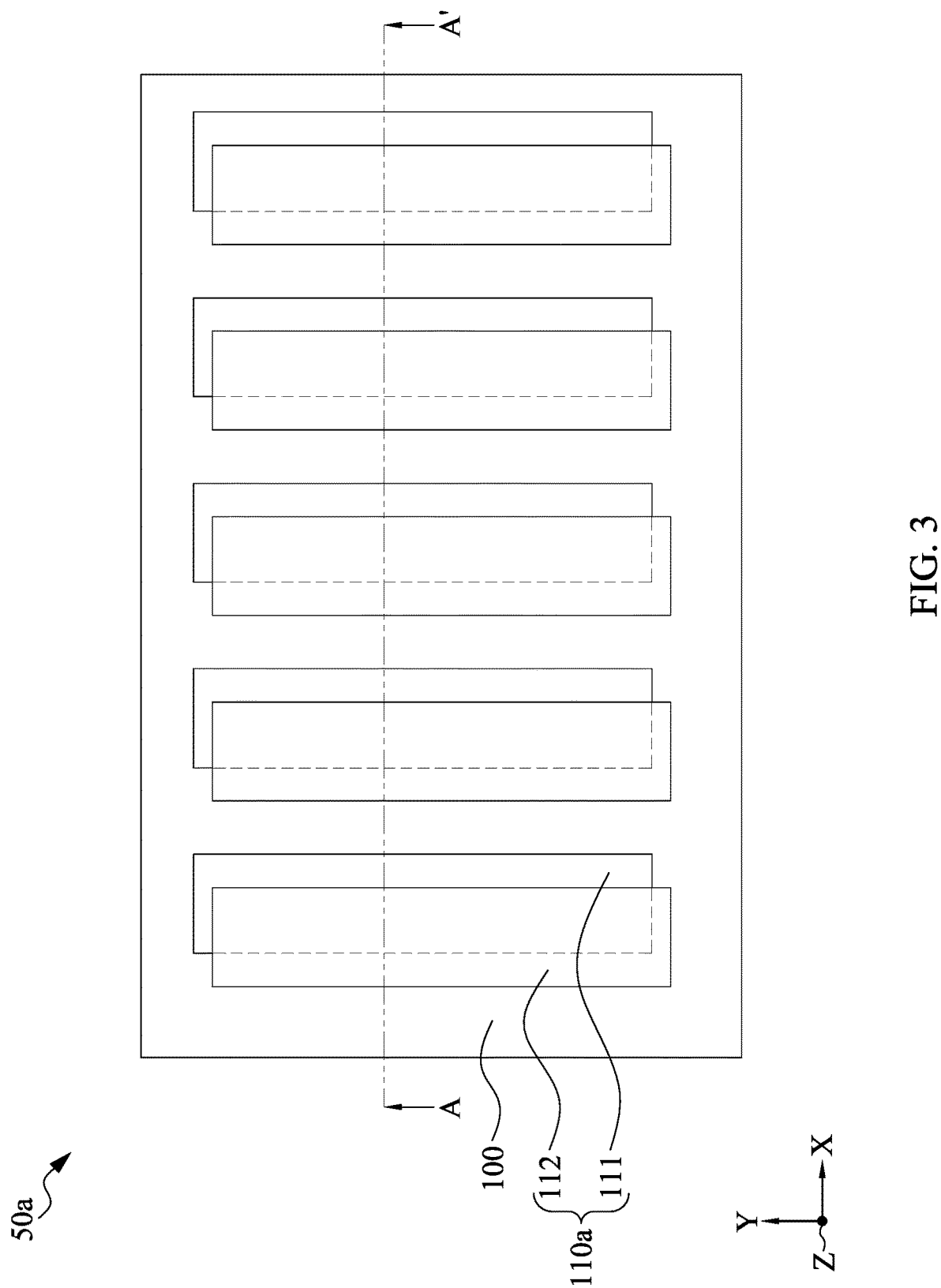
FIG. 3 is a top view of a semiconductor device structure, in accordance with some embodiments of the present disclosure.

FIG. 3 is a top view of a semiconductor device structure 50a according to various aspects of the present disclosure.

As shown in FIG. 3, the semiconductor device structure 50a, such as a wafer, can include the overlay mark structure 110a over a substrate 100. In some embodiments, the overlay mark structure 21 shown in FIG. 2 can include a pattern or a structure similar to or the same as that of the overlay mark structure 110a shown in FIG. 3. In some embodiments, the overlay mark structure 22 shown in FIG. 2 can include a pattern or a structure similar to or the same as that of the overlay mark structure 110a shown in FIG. 3.

The substrate 100 can be a semiconductor substrate, such as a bulk semiconductor, a semiconductor-on-insulator (SOI) substrate, or the like. The substrate 100 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 100 can have a multilayer structure, or the substrate 100 can include a multilayer compound semiconductor structure.

In some embodiments, the overlay mark structure 110a can be utilized to align different layers over the substrate 100 according to various aspects of the present disclosure. The overlay mark structure 110a can include patterns 111 and 112 over the substrate 100. The pattern 1/1 can be a pre-layer's pattern. The pattern 112 can be a current layer's pattern. The pre-layer (or a lower-layer) can be located at a horizontal level different from that of the current layer (or an upper-layer). The pre-layer (or a lower-layer) can be located at a horizontal level lower than that of the current layer (or an upper-layer). In some embodiments, the pattern 111 can at least partially overlap the pattern along the Z direction.

While measuring an overlay error using an overlay mark structure, such as the overlay mark structure 110a, an X-directional deviation is measured along a straight line in an X direction of the overlay mark structure 110a. A Y-directional deviation is further measured along a straight line in a Y direction of the overlay mark structure 110a. One single overlay mark structure, including the patterns 111 and 112, can be used to measure one X- and one Y-directional deviation between two layers on a substrate. Therefore, whether the current layer and the pre-layer are precisely aligned can be determined according to the X- and Y-directional deviations. The overlay error may include the X-directional deviation (ΔX), the Y-directional deviation (ΔY), or the combination of both.

Figure 4:
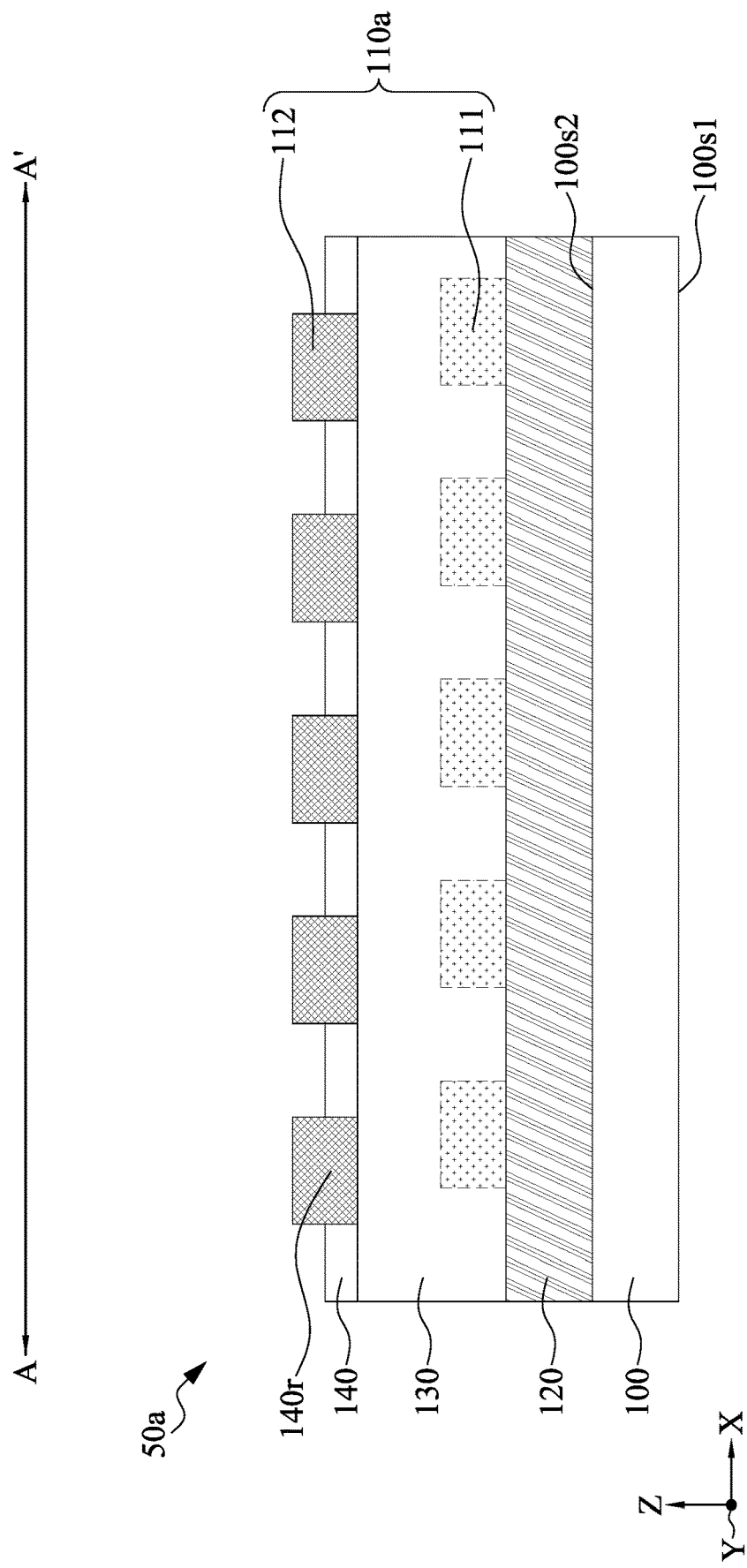
FIG. 4 is a cross-sectional view along line A-A' of FIG. 3, in accordance with some embodiments of the present disclosure.

FIG. 4 is a cross-sectional view along line A-A' of FIG. 3, in accordance with some embodiments of the present disclosure. In some embodiments, the semiconductor device structure 50a can further include a light-emitting feature 120, an intermediate structure 130, and a mask 140.

As shown in FIG. 4, the substrate 100 can have a surface 100s1 and a surface 100s2 opposite to the surface 100s1. The surface 100s2 of the substrate 100 can be an active surface, on which input/output terminals are disposed. The surface 100s1 of the substrate 100 can be a backside surface.

In some embodiments, the light-emitting feature 120 can be disposed on the surface 100s2 of the substrate 100. In some embodiments, the light-emitting feature 120 can be utilized to emit a light with a first waveband. In some embodiments, the light-emitting feature 120 can be utilized to emit a fluorescence with a first waveband. In some embodiments, the light-emitting feature 120 can include a dielectric layer and light-emitting materials therein. For example, after a light with a specific wavelength is incident to the light-emitting feature 120, the light-emitting materials can absorb the light and be excited. The excited light-emitting materials can emit a light with the first waveband. It should be noted that the light (or fluorescence) emitted by the light-emitting feature can be a light of a specific wavelength in other embodiments.

The wavelength of a light inducing a fluorescence can depend on the light-emitting materials of the light-emitting feature 120. In some embodiments, the first waveband (or wavelength) can range from about 100 nm to about 1000 nm, such as 100 nm, 200 nm, 300 nm, 400 nm, 500 nm, 600 nm, 700 nm, 800 nm, 900 nm or 1000 nm. For example, the wavelength of the emitted light from the light-emitting feature 120 can include a waveband ranging from about 300 nm to about 500 nm. In another example, the wavelength of the emitted light from the light-emitting feature 120 can be 617 nm.

The dielectric layer of the light-emitting feature 120 can include silicon oxide ($SiO_x$), silicon nitride ($Si_xN_y$), silicon oxynitride (SiON), or other suitable materials.

In some embodiments, the light-emitting materials of the light-emitting feature 120 can include metal ions of transition metals, such as europium (Eu), thulium (Tm), praseodymium (Pr), neodymium (Nd), samarium (Sm), terbium (Tb), dysprosium (Dy), holmium (Ho), erbium (Er), ytterbium (Yb), cerium (Ce), promethium (Pm), gadolinium (Gd), lutetium (Lu), thorium (Th), protactinium (Pa), uranium (U), neptunium (Np), plutonium (Pu), americium (Am), curium (Cm), berkelium (Bk), californium (Cf), einsteinium (Es), fermium (Fm), mendelevium (Md), nobelium (No), lawrencium (Lr), a combination thereof or other suitable metals.

In some embodiments, the light-emitting materials of the light-emitting feature 120 can include organic materials, such as a compound or polymer including aromatic groups. For example, the light-emitting materials of the light-emitting feature 120 can include a functional group selected from benzene, naphthalene, pyridine, pyrimidine, triazine, thiophene, isothiazole, triazole, pyridazine, pyrrole, pyrazole, imidazole, triazole, thiadiazole, pyrazine, furan, isoxazole, oxazole, oxadiazole, quinoline, isoquinoline, quinoxaline, quinazoline, oxadiazole, thiadiazole, benzotriazine, phthalazine, tetrazole, indole, benzofuran, benzothiophene, benzoxazole, benzothiazole, indazole, benzimidazole, benzotriazole, benzoisothiazole, benzothiadiazole, dibenzofuran, dibenzothiophene, dibenzoselenophene, carbazole, or other suitable functional groups.

In some embodiments, the light-emitting materials of the light-emitting feature 120 can include semiconductor materials. In some embodiments, the light-emitting materials of the light-emitting feature 120 can include homojunction, heterojunction, single-quantum well (SQW), multiple-quantum well (MQW) or any other applicable structure. In some embodiments, the light-emitting materials can include $In_xGa_{(1-x)}N$, $Al_xIn_yGa_{(1-x-y)}N$ or other suitable materials.

In some embodiments, the pattern 111 can be disposed on the light-emitting feature 120. In some embodiments, the pattern 111 can vertically overlap the light-emitting feature 120. In some embodiments, the pattern 111 can overlap the light-emitting feature 120 along the Z-direction. The pattern 111 can be disposed within or below an intermediate structure 130. In some embodiments, the pattern 111 may include a material which is the same as that of an isolation structure. In some embodiments, the pattern 111 may be disposed at an elevation the same as that of the isolation structure. The isolation structure can include, for example, a shallow trench isolation (STI), a field oxide (FOX), a local-oxidation of silicon (LOCOS) feature, and/or other suitable isolation elements. The isolation structure can include a dielectric material such as silicon oxide, silicon nitride, silicon oxynitride, fluoride-doped silicate (FSG), a low-k dielectric material, combinations thereof, and/or other suitable materials.

In some embodiments, the pattern 111 can include a material which is the same as that of a gate structure. The gate structure can be sacrificial, for example, a dummy gate structure. In some embodiments, the pattern 111 can be disposed at an elevation which is the same as that of the gate structure. In some embodiments, the pattern 111 can include a dielectric layer, the material of which is the same as that of a gate dielectric layer and a conductive layer, the material of which is the same as that of a gate electrode layer.

In some embodiments, the gate dielectric layer can include silicon oxide ($SiO_x$), silicon nitride ($Si_xN_y$), silicon oxynitride (SiON), or a combination thereof. In some embodiments, the gate dielectric layer can include dielectric material(s), such as high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of the disclosure.

In some embodiments, the gate electrode layer can include a polysilicon layer. In some embodiments, the gate electrode layer can be made of conductive material, such as aluminum (Al), copper (Cu), tungsten (W), titanium (Ti), tantalum (Ta), or other applicable materials. In some embodiments, the gate electrode layer can include a work function layer. The work function layer is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate electrode layer can be formed by low-pressure chemical vapor deposition (LPCVD) and plasma-enhanced CVD (PECVD).

In some embodiments, the pattern 111 can include a material which is the same as that of a conductive via, which can be disposed on a conductive trace, such as the zero metal layer (M0), first metal layer (M1), second metal layer (M2), and so on. In this embodiment, the pattern 111 can include a barrier layer and a conductive layer surrounded by the barrier layer. The barrier layer can include metal nitride or other suitable materials. The conductive layer can include metal, such as W, Ta, Ti, Ni, Co, Hf, Ru, Zr, Zn, Fe, Sn, Al, Cu, Ag, Mo, Cr, alloy or other suitable materials. In this embodiment, the pattern 111 can be formed by suitable deposition processes such as, for example, sputter and physical vapor deposition (PVD).

The intermediate structure 130 can include one or more intermediate layers made of insulating material, such as silicon oxide or silicon nitride. In some embodiments, the intermediate structure 130 can include conductive layers, such as metal layers or alloy layers.

The pattern 112 is disposed on the intermediate structure 130. The pattern 112 can be disposed on or over the surface 100s2 of the substrate 100. In some embodiments, the pattern 112 can at least vertically overlap the pattern 111. In some embodiments, the pattern 112 can at least overlap the pattern 111 along the Z direction. In some embodiments, the pattern 112 can at least vertically overlap the light-emitting feature 120. In some embodiments, the pattern 112 can at least overlap the light-emitting feature 120 along the Z direction. In some embodiments, the pattern 112 can be a plurality of openings 140r defined by a mask 140.

The mask 140 can be formed on the intermediate structure 130, and will be removed in subsequent processes. The mask 140 can include a positive-tone or negative-tone photoresist such as polymer, or a hard mask such as silicon nitride or silicon oxy-nitride. The current layer, including the mask 140 and the pattern 112, can be patterned using suitable photolithography processes such as, for example, forming a photoresist layer over the intermediate structure 130, exposing the photoresist layer to a pattern by a reticle, baking and developing the photoresist to form the mask 140 and the pattern 112. The mask 140 may then be used to define a pattern into the intermediate structure 130 such that the portion of the intermediate structure 130 exposed from the photoresist layer can be removed.

In some embodiments, the overlay mark structure 110a can be configured to absorb and/or reflect a light (or fluorescence) emitted from the light-emitting feature 120. In some embodiments, the pattern 111 can be configured to absorb and/or reflect a light (or fluorescence) emitted from the light-emitting feature 120. The pattern 111 can have a first transmittance to the first waveband (or wavelength) of a light (or fluorescence) emitted by the light-emitting feature 120. The pattern 112 can have a second transmittance to the first waveband (or wavelength) of a light (or fluorescence) emitted by the light-emitting feature 120. In some embodiments, the first transmittance is different from the second transmittance. In some embodiments, the first transmittance is smaller than the second transmittance. In some embodiments, the first transmittance can be smaller than 30%, such as 30%, 20%, 15%, 10%, 7%, 5%, 3%, 1%, or even smaller. A larger difference of the transmittances between the patterns 111 and 112 can assist in identification of the patterns 11 and 112 of an optical image by overlay measurement equipment. In this embodiment, the light (or fluorescence) emitted by the light-emitting feature 120 can improve contrast between the patterns 111 and 112 of an optical image. For example, the profiles of the patterns 111 and 112 in an optical image can be clearly identified by a sensor of overlay measurement equipment. Thus, the overlay error can be calculated more accurately.

Figure 4A:
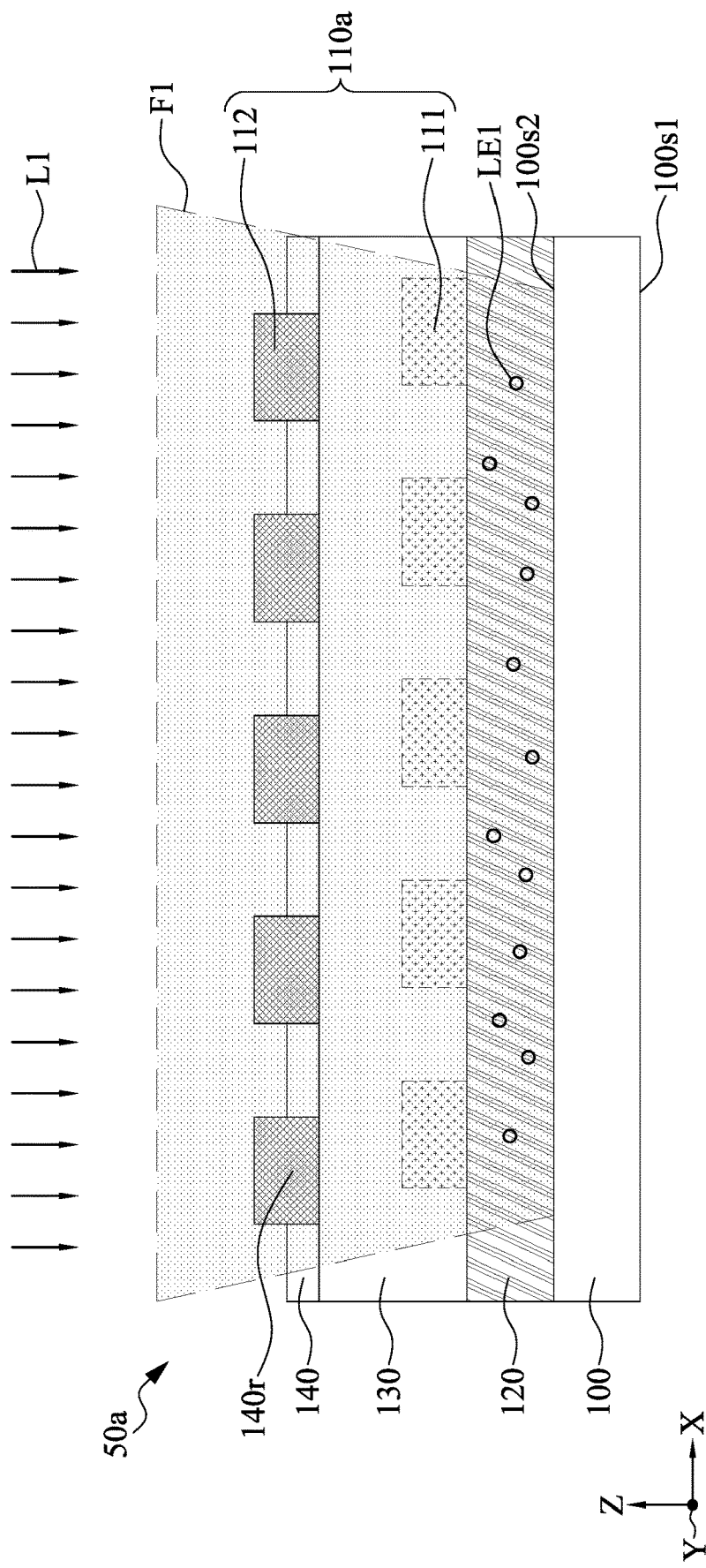
FIG. 4A illustrates mechanism of a light emission of the light-emitting feature.

FIG. 4A illustrates mechanism of a light emission of the light-emitting feature 120.

In some embodiments, the light-emitting feature 120 can include metal ions LE1 therein. In some embodiments, when metal ions LE1 receive light L1, the light-emitting feature 120 can emit a light (or fluorescence) F1. In some embodiments, the first transmittance of the pattern 111 to the light (or fluorescence) F1 and the second transmittance of the pattern 112 to the light (or fluorescence) F1 are different.

Figure 5:
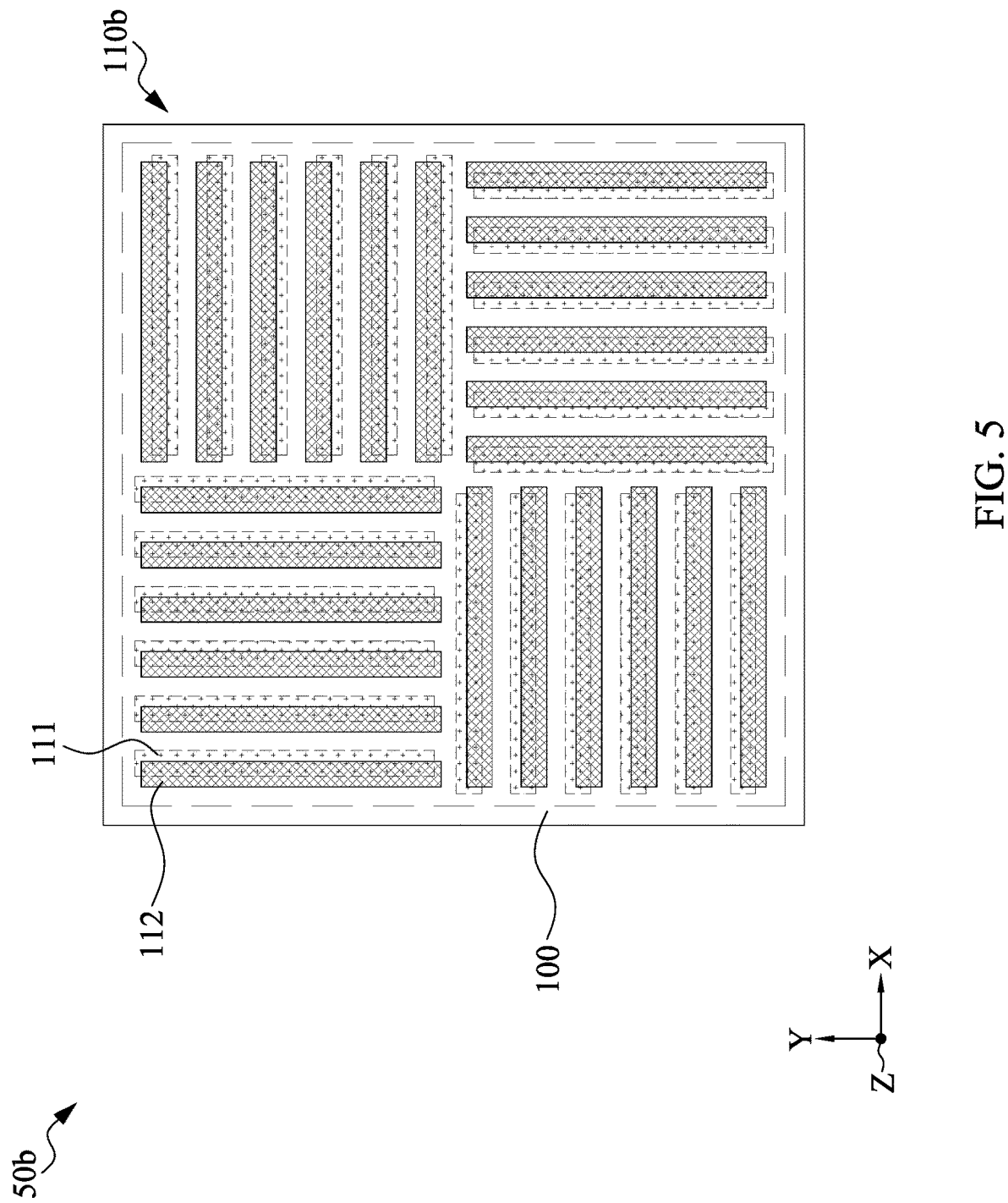
FIG. 5 is a top view of a semiconductor device structure, in accordance with some embodiments of the present disclosure.

FIG. 5 is a top view of a semiconductor device structure 50b, in accordance with some embodiments of the present disclosure. The semiconductor device structure 50b shown in FIG. 5 can be similar to the semiconductor device structure 50a shown in FIG. 3, differing in that the semiconductor device structure 50b can include an overlay mark structure 110b replacing the overlay mark structure 110a.

As shown in FIG. 5, the overlay mark structure 110b can include multiple patterns 111 and 112. Each of the patterns 111 or 112 can be located in one of four quadrature targets areas, two of which are configured to measure the overlay error of the X direction, and two of which are configured to measure the overlay error of the Y direction.

Figure 6A:
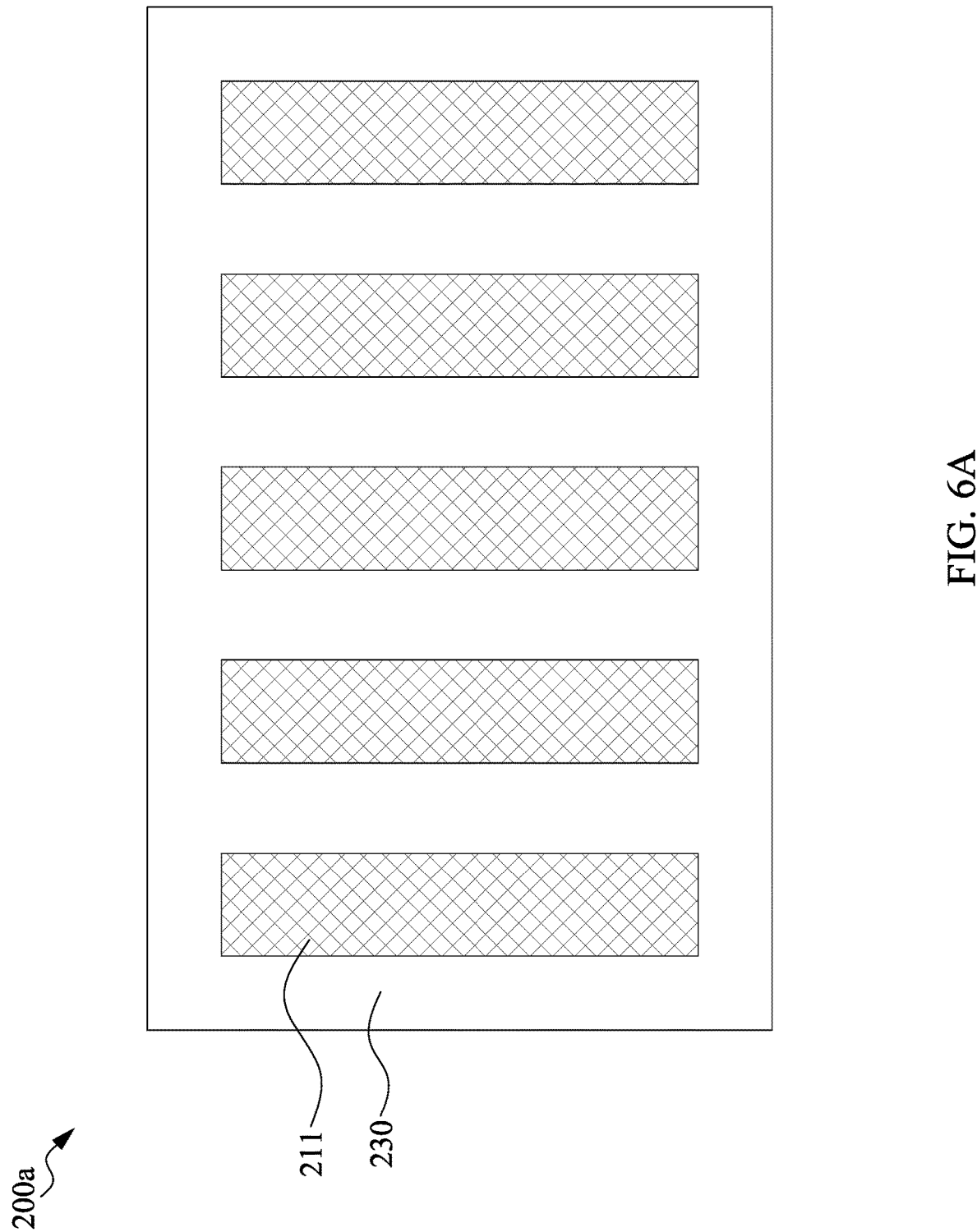
FIG. 6A is an optical image of a semiconductor device structure, in accordance with some embodiments of the present disclosure.

FIG. 6A is an optical image 200a of a semiconductor device structure in accordance with some embodiments of the present disclosure.

In some embodiments, the optical image 200a can include profiles 211 and 230. The profile 211 can correspond to an image of the pattern 111. The profile 230 can correspond to an image of the intermediate structure 130. In some embodiments, the intermediate structure 130 can have a third transmittance to the first waveband (or wavelength) of a light (or fluorescence) emitted by the light-emitting feature 120. In some embodiments, the first transmittance is different from the third transmittance. In some embodiments, the first transmittance is smaller than the third transmittance. As shown in FIG. 6A, the brightness of the profile 230 can exceed that of the profile 211 in the optical image 200a.

Figure 6B:
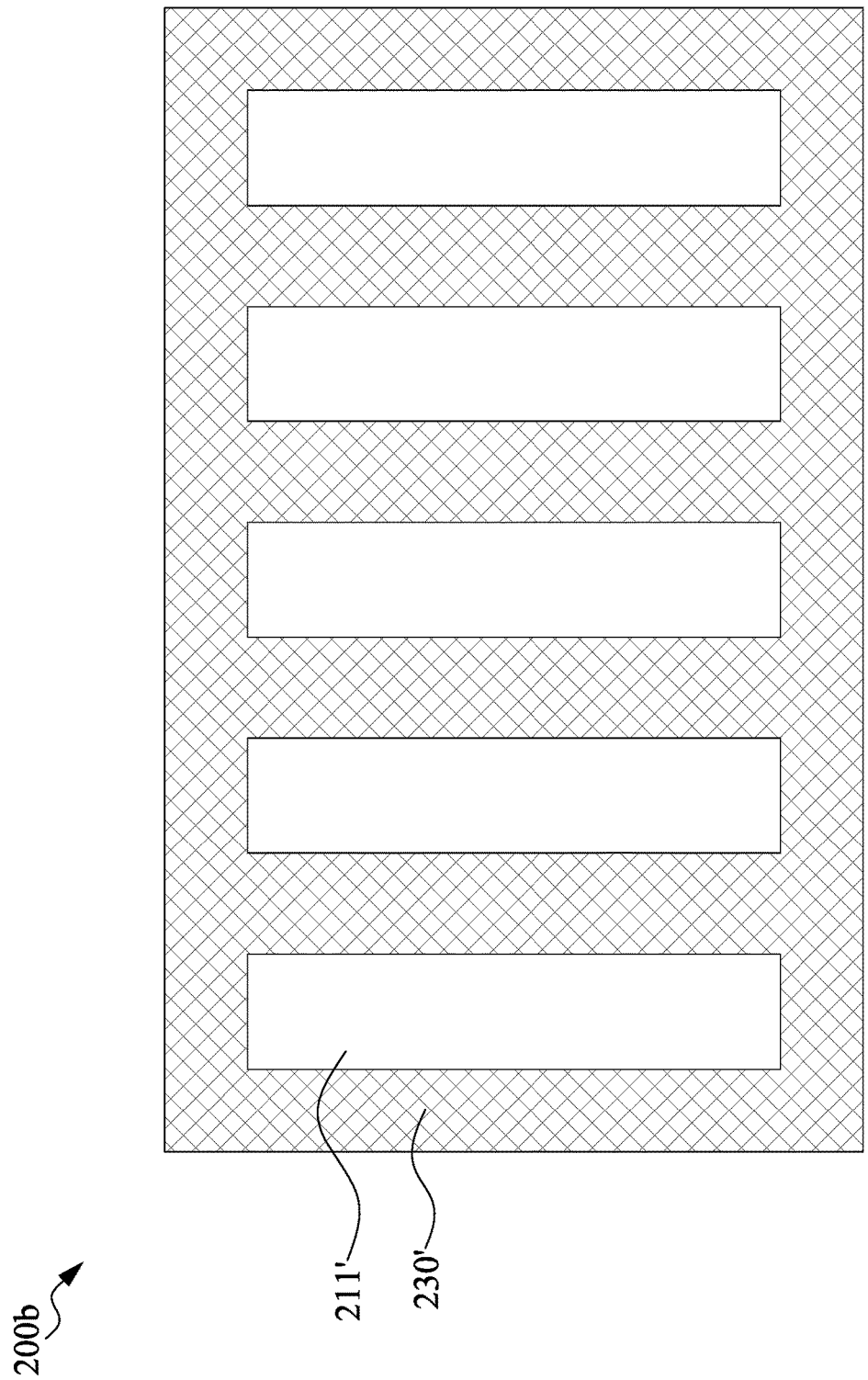
FIG. 6B is an optical image of a semiconductor device structure, in accordance with some embodiments of the present disclosure.

FIG. 6B is an optical image 200b of a semiconductor device structure, in accordance with some embodiments of the present disclosure.

In some embodiments, the optical image 200b can include profiles 211' and 230'. The profile 211' can correspond to an image of the pattern 111. The profile 230' can correspond to an image of the intermediate structure 130. In some embodiments, the first transmittance can exceed the third transmittance. As shown in FIG. 6B, the brightness of the profile 211' can exceed that of the profile 230' in the optical image 200b.

In this embodiment, the contrast between the pattern 111 and the intermediate structure 130 of an optical image (e.g., 200a or 200b) can be improved, assisting in identification of the profile of the pattern 111. Thus, the overlay error can be calculated more accurately.

Similarly, the contrast between the pattern 112 and the intermediate structure 130 can be controlled or modified. In some embodiments, the second transmittance can be smaller than the third transmittance. In some embodiments, the second transmittance can exceed the third transmittance. In some embodiments, the third transmittance can range between the first transmittance and the second transmittance. By tuning the relation among the first transmittance, the second transmittance, and the third transmittance, the overlay error can be calculated more accurately.

Figure 7:
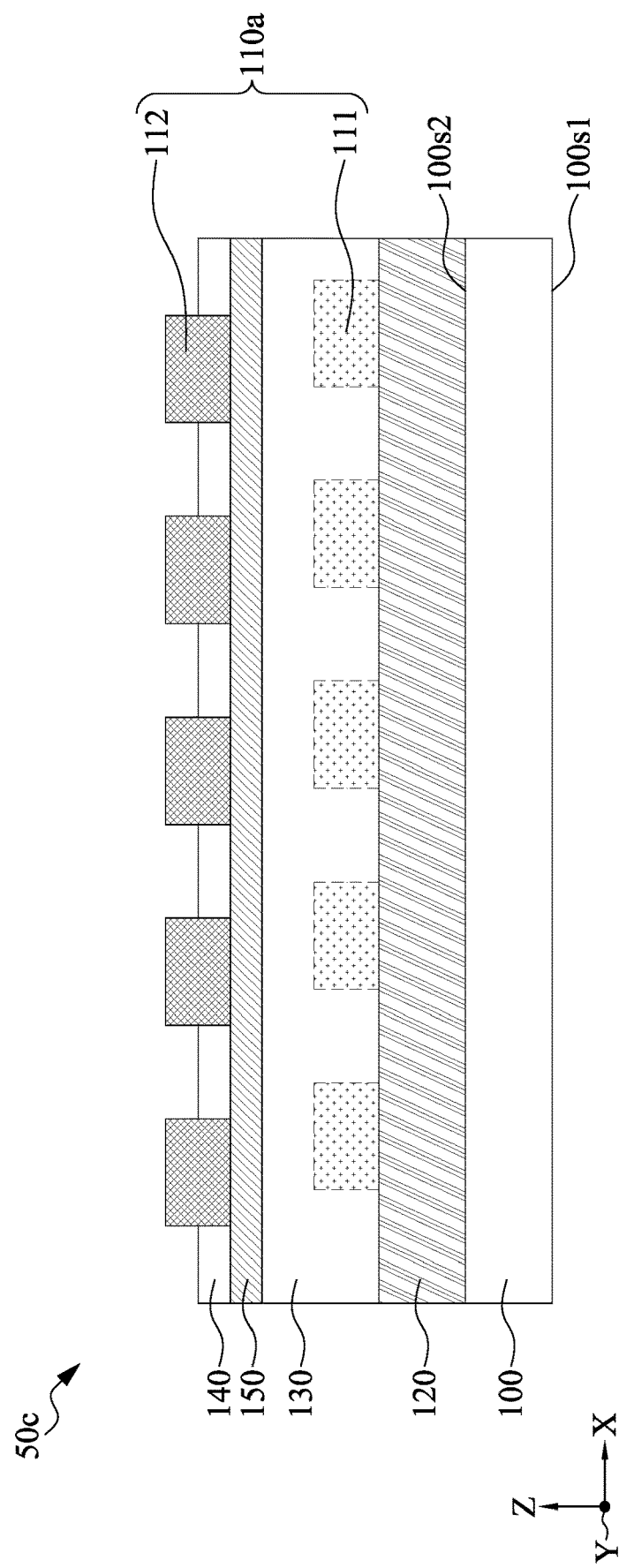
FIG. 7 is a cross-sectional view of a semiconductor device structure, in accordance with some embodiments of the present disclosure.

FIG. 7 is a cross-sectional view of a semiconductor device structure 50c according to various aspects of the present disclosure. The semiconductor device structure 50c shown in FIG. 7 can be similar to the semiconductor device structure 50a shown in FIG. 4, differing in that the semiconductor device structure 50c can further include a light-emitting feature 150.

In some embodiments, the light-emitting feature 150 can be disposed under the pattern 112. In some embodiments, the light-emitting feature 150 can be disposed between the patterns 111 and 112. In some embodiments, the light-emitting feature 150 can be disposed between the intermediate structure 130 and the pattern 112. In some embodiments, the light-emitting feature 150 can be embedded in the intermediate structure 130. In some embodiments, the pattern 112 can vertically overlap the light-emitting feature 150. In some embodiments, the pattern 112 can overlap the light-emitting feature 150 along the Z-direction. In some embodiments, the light-emitting feature 150 can be utilized to emit a light with a second waveband (or wavelength) different from the first waveband (or wavelength). In some embodiments, the light-emitting feature 150 can be utilized to emit a fluorescence with the second waveband (or wavelength). In some embodiments, the light-emitting feature 150 can include a dielectric layer and light-emitting materials doped therein. For example, after a light with a specific wavelength is incident to the light-emitting feature 150, the light-emitting materials can absorb the light and be excited. The excited light-emitting materials can emit a light with the second waveband (or wavelength).

The wavelength of a light inducing a fluorescence can depend on the light-emitting materials of the light-emitting feature 150. In some embodiments, the second waveband (or wavelength) can range from about 100 nm to about 1000 nm, such as 100 nm, 200 nm, 300 nm, 400 nm, 500 nm, 600 nm, 700 nm, 800 nm, 900 nm or 1000 nm.

The dielectric layer of the light-emitting feature 150 can include silicon oxide ($SiO_x$), silicon nitride ($Si_xN_y$), silicon oxynitride (SiON), or other suitable materials.

In some embodiments, the light-emitting materials of the light-emitting feature 150 can include metal ions of transition metals, such as Eu, Tm, Pr, Nd, Sm, Tb, Dy, Ho, Er, Yb, Ce, Pm, Gd, Lu, Th, Pa, U, Np, Pu, Am, Cm, Bk, Cf, Es, Fm, Md, No, Lr or other suitable metals. In some embodiments, the light-emitting materials of the light-emitting feature 150 can include organic materials, such as a compound or polymer including aromatic groups. In some embodiments, the light-emitting materials of the light-emitting feature 150 can include semiconductor materials. In some embodiments, the light-emitting materials of the light-emitting feature 150 can include homojunction, heterojunction, single-quantum well (SQW), multiple-quantum well (MQW) or any other applicable structure.

In some embodiments, the overlay mark structure 110a can be configured to absorb and/or reflect a light (or fluorescence) emitted from the light-emitting feature 150. In some embodiments, the pattern 112 can be configured to absorb and/or reflect a light (or fluorescence) emitted from the light-emitting feature 150. The pattern 112 can have a fourth transmittance to the second waveband (or wavelength) of a light (or fluorescence) emitted by the light-emitting feature 150. In some embodiments, the fourth transmittance is different from the first transmittance. In some embodiments, the fourth transmittance is different from the second transmittance. In some embodiments, the fourth transmittance is smaller than the second transmittance. In some embodiments, the fourth transmittance is different from the third transmittance. In some embodiments, the fourth transmittance is smaller than the third transmittance. In some embodiments, the fourth transmittance can be smaller than 30%, such as 30%, 20%, 15%, 10%, 7%, 5%, 3%, 1%, or even smaller. The light (or fluorescence) emitted by the light-emitting feature 150 can improve the contrast of the patterns 111, 112, and/or intermediate structure 130. Thus, the overlay error can be calculated more accurately.

Figure 7A:
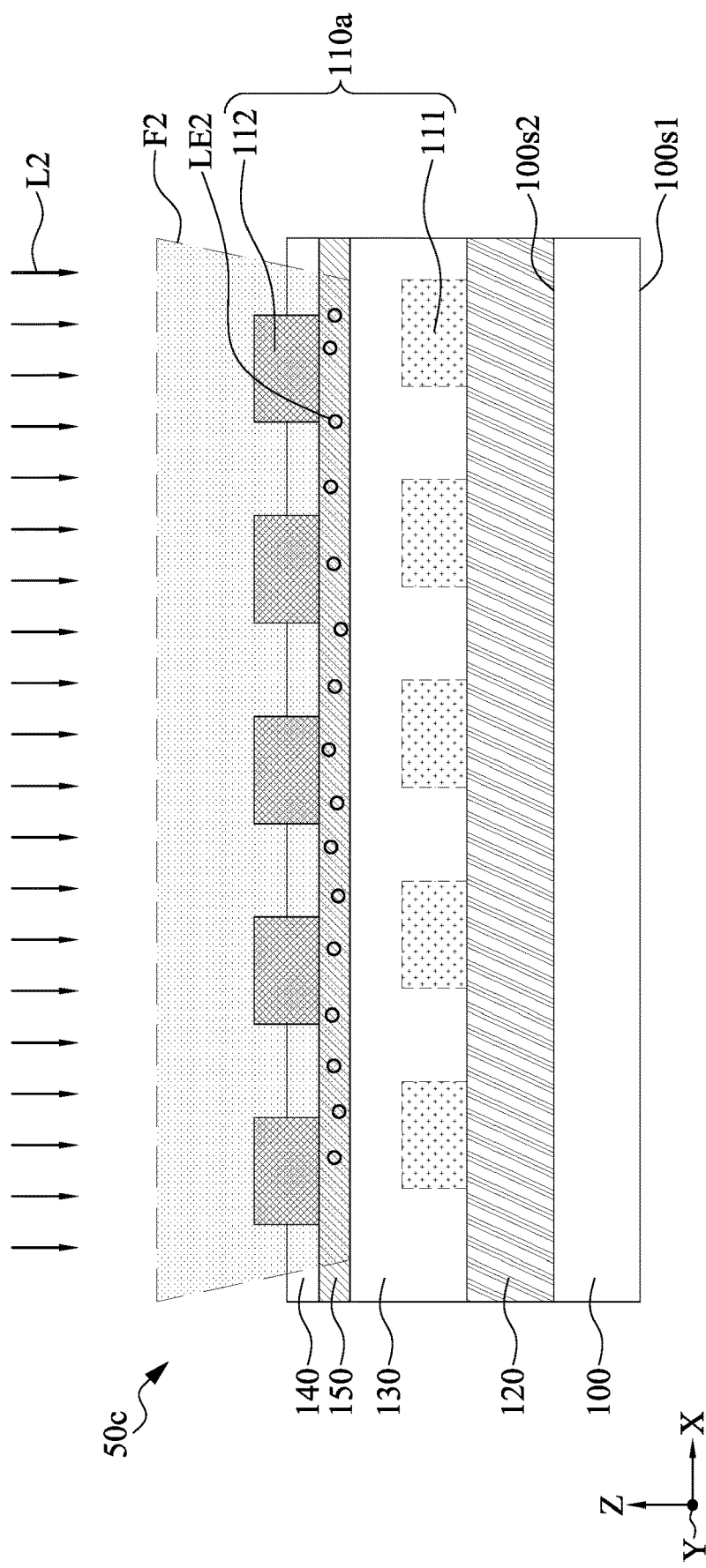
FIG. 7A illustrates mechanism of a light emission of the light-emitting feature.

FIG. 7A illustrates mechanism of a light emission of the light-emitting feature 150.

In some embodiments, the light-emitting feature 150 can include metal ions LE2 therein. In some embodiments, when metal ions LE2 receive light L2, the light-emitting feature 150 can emit a light (or fluorescence) F2. In some embodiments, the third transmittance of the pattern 112 to the light (or fluorescence) F2 and the second transmittance of the pattern 112 to the light (or fluorescence) F1 (shown in FIG. 4A) are different. In some embodiments, the wavelength of the light L1 can be different from that of the light L2. In some embodiments, the wavelength of the (or fluorescence) F2 can be different from that of the (or fluorescence) F2. In some embodiments, the metal ions LE1 can be different from the metal ions LE2.

Figure 8:
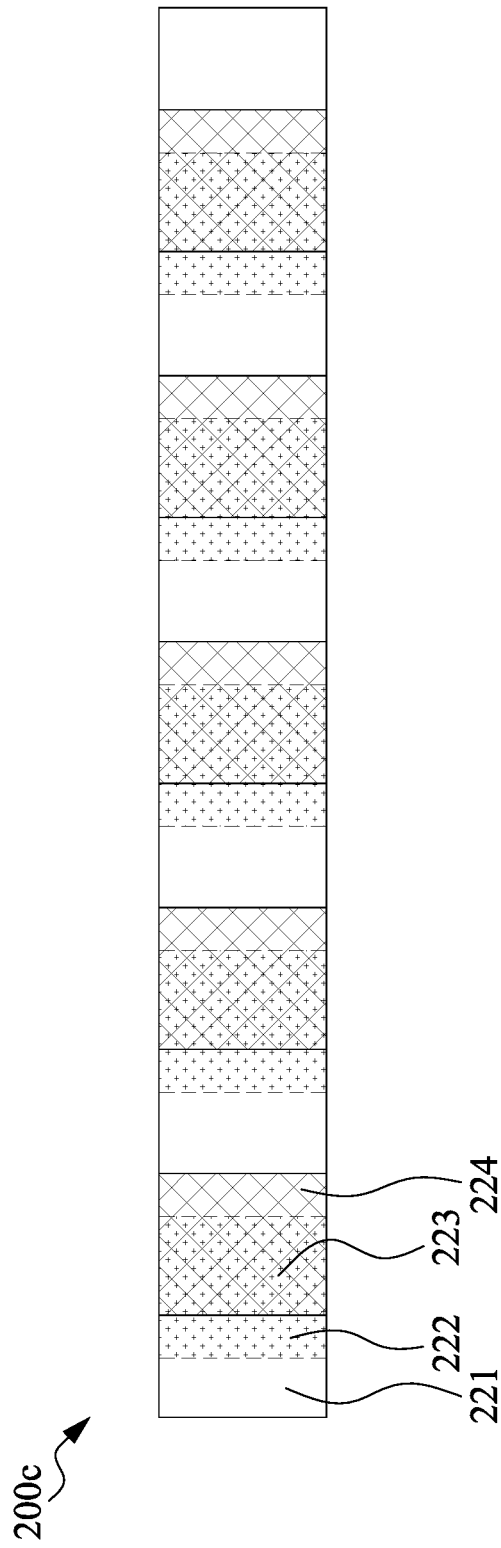
FIG. 8 is an optical image of a semiconductor device structure, in accordance with some embodiments of the present disclosure.

FIG. 8 is an optical image 200c of a semiconductor device structure, in accordance with some embodiments of the present disclosure.

In this embodiment, the overlay error between the patterns 111 and 112 is not equal to zero. That is, the patterns 111 and 112 have an offset along the X-direction, Y-direction or a combination thereof. In some embodiments, the optical image 200c can include profiles 221, 222, 223, and 224. The profile 221 can correspond to an image of a region wherein no patterns 111 and 112 are disposed over the intermediate structure 130. The profile 222 can correspond to an image of a region wherein the pattern 112 does not vertically overlap the pattern 111. The profile 223 can correspond to an image of a region wherein pattern 111 vertically overlaps the pattern 112. The profile 224 can correspond to an image of a region wherein the pattern 111 does not vertically overlap the pattern 112.

In some embodiments, the profile 221 can present a color including the first waveband (or wavelength) and the second waveband (or wavelength). In some embodiments, the profile 222 can present a color including the first waveband (or wavelength). In some embodiments, the profile 223 can present a color with less brightness in comparison with the profiles 221, 222 or 224. In some embodiments, the profile 224 can present a color including the second waveband (or wavelength).

Since the contrast among the patterns 111, pattern 112, and an overlap region between the patterns 111 and 112 in the optical image 200c can be improved, the overlay error can be calculated more accurately.

Figure 9:
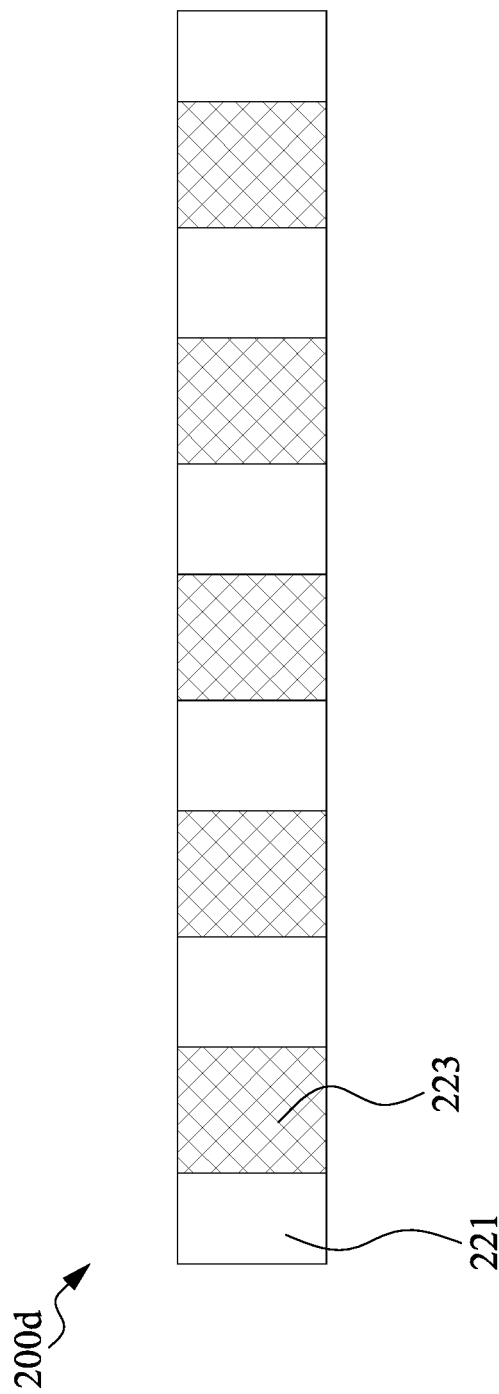
FIG. 9 is an optical image of a semiconductor device structure, in accordance with some embodiments of the present disclosure.

FIG. 9 is an optical image 200d of a semiconductor device structure, in accordance with some embodiments of the present disclosure.

In this embodiment, the overlay error between the patterns 111 and 112 is equal to zero. That is, the pattern 111 is aligned to the pattern 112 along the X-direction and Y-direction. In some embodiments, the optical image 200d can include the profile 221 and the profile 223.

By calculating the area of the profile 223, the degree of the overlay error can be determined. Since the profile 223 can be clearly identified in this embodiment, the overlay error can be calculated more accurately.

Figure 10:
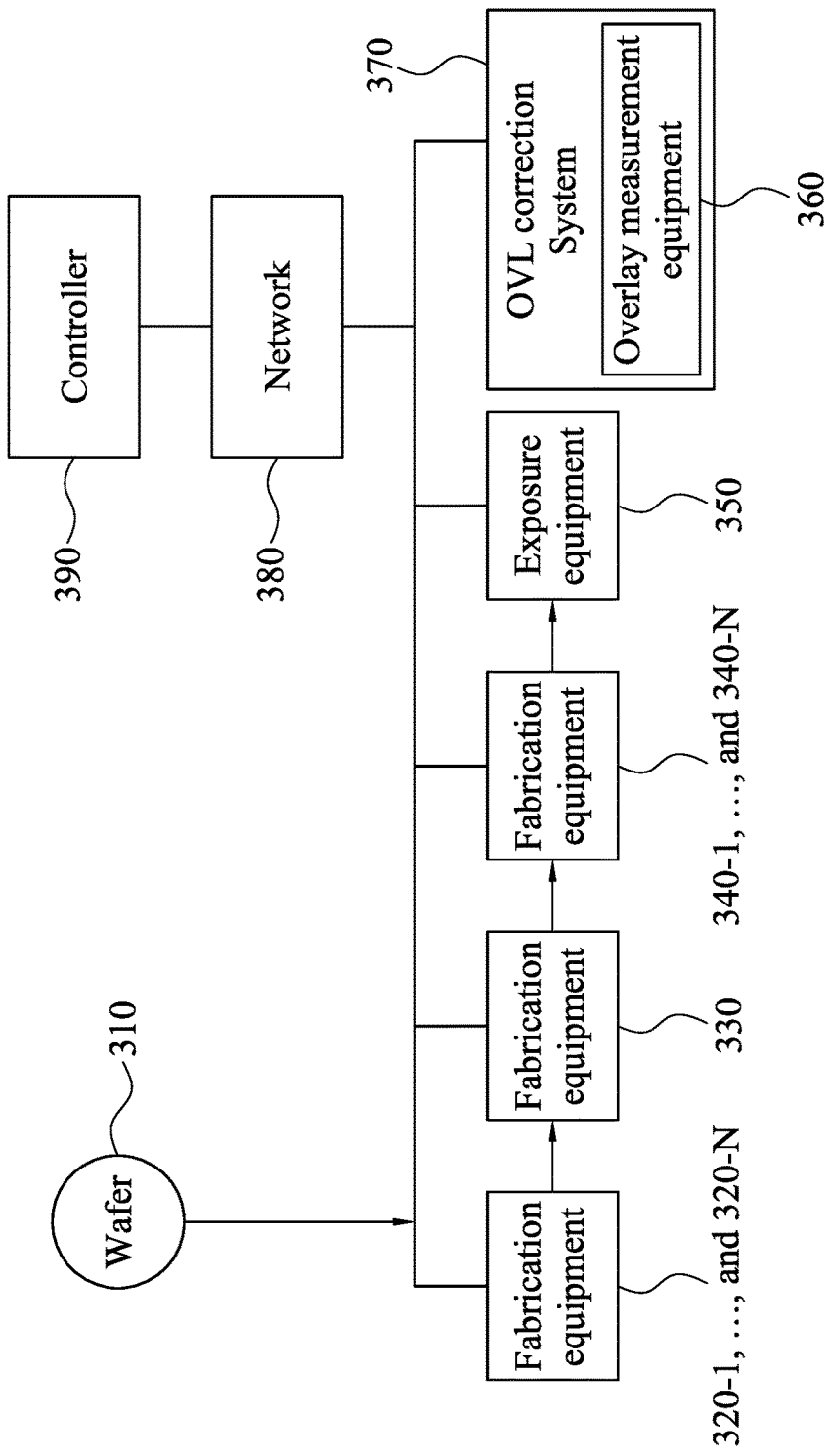
FIG. 10 is a block diagram illustrating a semiconductor fabrication system, in accordance with some embodiments of the present disclosure.

FIG. 10 is a block diagram illustrating a semiconductor fabrication system 300, in accordance with some embodiments of the present disclosure.

The semiconductor fabrication system 300 can include fabrication equipment 320-1, . . . , and 320-N, 330, 340-1, . . . , and 340-N, exposure equipment 350, as well as overlay measurement equipment 360. An overlay correction system 370 can be included or built in the overlay measurement equipment 360. The fabrication equipment 320-1, . . . , and 320-N, 330, 340-1, . . . , and 340-N, exposure equipment 350, as well as overlay measurement equipment 360 can be signally coupled with a controller 390 through a network 380. In some embodiments, the overlay correction system 370 can be an independent system signally coupled to the overlay measurement equipment 360 through the network 380.

The fabrication equipment 320-1, . . . , and 320-N can be used to form elements or features between the pre-layer (e.g., the pattern 111) and the substrate, such as the light-emitting feature 120 shown in FIG. 4. Each piece of the fabrication equipment 320-1, . . . , and 320-N can be used to perform a deposition process, an etching process, a chemical mechanical polishing process, photoresist coating process, baking process, an alignment process, or other processes.

The fabrication equipment 330 can be used to form the pattern in a pre-layer, such as the pattern 111 shown in FIG. 4. In some embodiments, the fabrication equipment 330 may be used to form an isolation structure, a gate structure, a conductive via or other layers. The pattern of the pre-layer may include dielectric material, semiconductor material or conductive material.

The fabrication equipment 340-1, . . . , and 340-N can be used to form an intermediate structure, such as the intermediate structure 130 shown in FIG. 4. Each piece of the fabrication equipment 340-1, . . . , and 340-N can be used to perform a deposition process, an etching process, a chemical mechanical polishing process, photoresist coating process, baking process, an alignment process, or other processes.

The exposure equipment 350 can be used to form the pattern of a current layer, such as the pattern 112 shown in FIG. 4.

In some embodiments, the overlay measurement equipment 360 can be used to obtain optical images of the patterns of the pre-layer and the current layer, and to generate overlay error based on the aforesaid optical images (e.g., patterns 200a, 200b, 200c or 200d) of the patterns of the pre-layer and the current layer (e.g., patterns 111 and 112).

The overlay correction system 370 can include correction parameters used to generate corrected first and second overlay errors. The overlay correction system 370 can include, for example, a calculator or a server. In some embodiments, the corrected overlay error can be generated or calculated by program codes or program languages. For example, the corrected overlay error can be determined by the overlay error obtained from the overlay measurement equipment 360 and the correction parameters of the overlay correction system 370. In some embodiments, an X-directional deviation ($\Delta X$), Y-directional deviation ($\Delta Y$), or the combination of both, can be generated from the correction parameters. Each of the X-directional deviation ($\Delta X$), the Y-directional deviation ($\Delta Y$), or the combination of both can be represented by equation(s) involving the correction parameters as variables. In some embodiments, the overlay correction system 370 can receive the information of optical images from the pre-layer's pattern and the current layer's pattern, and then generates the X-directional deviation ($\Delta X$), Y-directional deviation ($\Delta Y$), or combination of both to compensate the overlay error obtained from the overlay measurement equipment 360.

The network 380 can be the internet or an intranet implementing network protocols such as transmission control protocol (TCP). Through the network 380, each piece of fabrication equipment 320-1, . . . , and 320-N, 330, 340-1, . . . , and 340-N, exposure equipment 350, as well as overlay measurement equipment 360 may download or upload work in progress (WIP) information regarding to the wafer or the fabrication equipment from or to the controller 390.

The controller 390 can include a processer, such as a central processing unit (CPU). In some embodiments, the controller 390 can be utilized to generate an instruction whether to adjust the exposure equipment 350 based on the first overlay error and the second overlay error.

Although FIG. 10 does not show any other fabrication equipment before the fabrication equipment 320, the exemplary embodiment is not intended to be limiting. In other exemplary embodiments, various kinds of fabrication equipment can be scheduled before the fabrication equipment 320, and can be used to perform various processes according to the design requirement.

In the exemplary embodiments, a wafer 310 is transferred to the fabrication equipment 320 to start a sequence of different processes. The wafer 310 may be processed by various stages forming at least one layer of material. The exemplary embodiments are not intended to limit the progress of the wafer 310. In other exemplary embodiments, the wafer 310 may include various layers, or any stages between the beginning and the completion of a product, before the wafer 310 is transferred to the fabrication equipment 320. In the exemplary embodiments, the wafer 310 can be processed by the fabrication equipment 320-1, . . . , and 320-N, 330, 340-1, . . . , and 340-N, exposure equipment 350, as well as overlay measurement equipment 360 in a sequential order.

Figure 11:
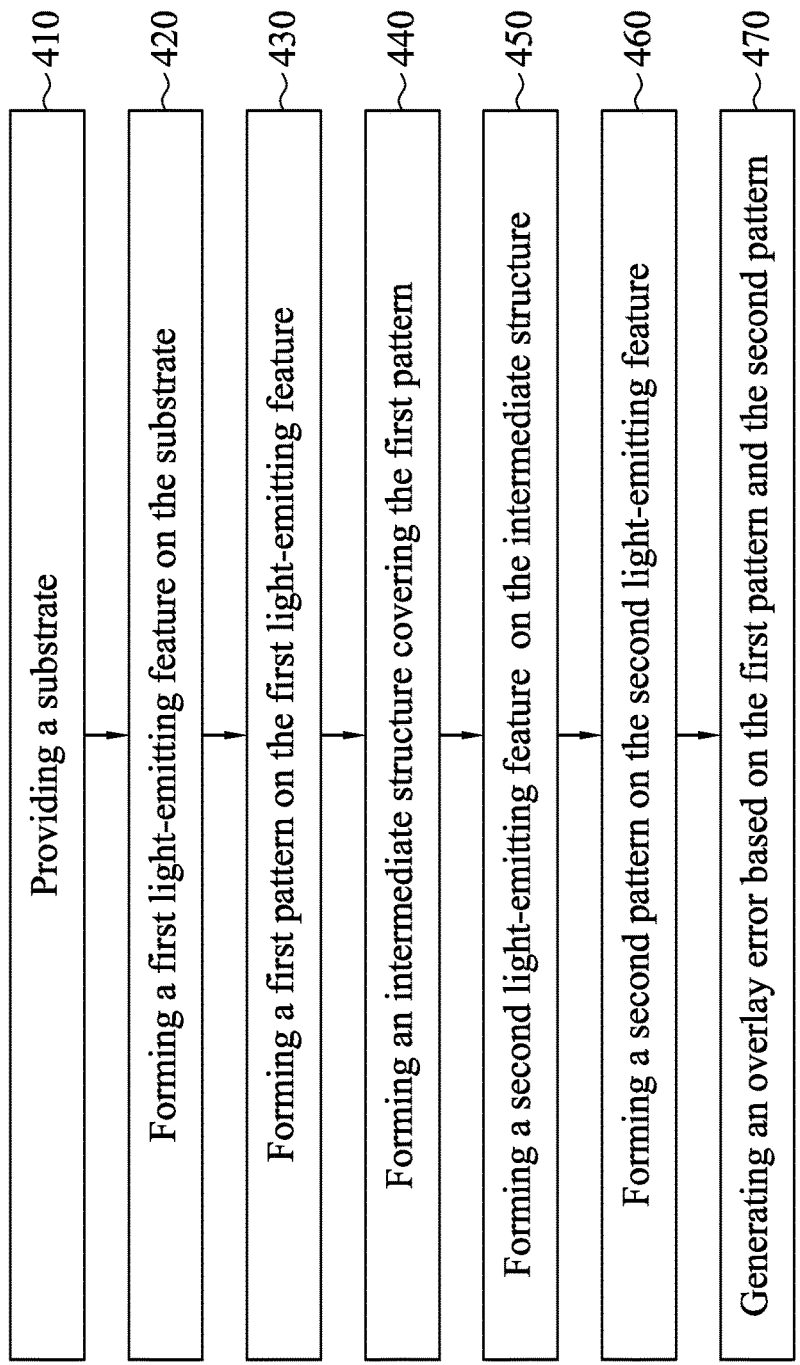
FIG. 11 is a flow chart illustrating a method for manufacturing a semiconductor device structure, in accordance with various aspects of the present disclosure.

FIG. 11 is a flow chart illustrating a method for manufacturing a semiconductor device structure, in accordance with various aspects of the present disclosure.

The method 400 begins with operation 410 in which a substrate is provided. The substrate can have a first surface and a second surface opposite to the first surface. The first surface can also be referred to as a backside surface. The second surface can also be referred to as an active surface, on which active features, such as gate structures or traces connected to input/output terminals, are formed.

The method 400 continues with operation 420 in which a first light-emitting feature is formed on the substrate. In some embodiments, the first light-emitting feature can include light-emitting materials in a dielectric layer. In some embodiments, the light-emitting materials can include metal ions of, for example, Eu, Tm, Pr, Nd, Sm, Tb, Dy, Ho, Er, Yb, Ce, Pm, Gd, Lu, Th, Pa, U, Np, Pu, Am, Cm, Bk, Cf, Es, Fm, Md, No, Lr or other suitable metals. In some embodiments, the aforesaid metal ions can be formed in a liquid dielectric material. The liquid dielectric material, including metal ions, can be formed on the substrate by, for example, spin-coating. An annealing process and/or a baking process can be performed to cure the liquid dielectric material, thereby forming the first light-emitting feature. In other embodiments, the first light-emitting feature can include organic materials and/or semiconductor materials, and can be formed by suitable processes. The first light-emitting feature can be formed by equipment 320-1, . . . , and 320-N shown in FIG. 10.

The method 400 continues with operation 430 in which a first pattern is formed on the second surface of the substrate. The first pattern can include a material which is the same as that of the isolation features, gate structures, or conductive vias. The first pattern can be formed by processes utilized to form isolation features, gate structures, or conductive vias. The first pattern can be formed by equipment 330 shown in FIG. 10.

The method 400 continues with operation 440 in which an intermediate structure is formed to cover the first pattern. The intermediate structure can include one or more intermediate layers made of insulating material, such as silicon oxide or silicon nitride. The intermediate structure can include conductive features formed in the dielectric layers. In some embodiments, the intermediate structure can be formed by CVD, PVG, ALD, dry etching, wet etching, CMP, or photolithography processes. The first light-emitting feature can be formed by equipment 340-1, . . . , and 340-N shown in FIG. 10.

The method 400 continues with operation 450 in which a second light-emitting feature is formed on the substrate. In some embodiments, the second light-emitting feature can include light-emitting materials in a dielectric layer. In some embodiments, the light-emitting materials can include metal ions, such as Eu, Tm, Pr, Nd, Sm, Tb, Dy, Ho, Er, Yb, Ce, Pm, Gd, Lu, Th, Pa, U, Np, Pu, Am, Cm, Bk, Cf, Es, Fm, Md, No, Lr or other suitable metals. In some embodiments, the aforesaid metal ions can be formed in a liquid dielectric material. The liquid dielectric material, including metal ions, can be formed on the intermediate structure by, for example, spin-coating. An annealing process and/or a baking process can be performed to cure the liquid dielectric material, thereby forming the second light-emitting feature. In other embodiments, the first light-emitting feature can include organic materials and/or semiconductor materials, and can be formed by suitable processes. In some embodiments, operation 450 is optional. In some embodiments, operation 450 can be omitted.

The method 400 continues with operation 460 in which a second pattern is formed on the intermediate structure. In some embodiments, the second pattern can be openings of a mask, such as a photoresist layer. In some embodiments, the operation 460 can include, for example, forming a photoresist layer over the intermediate structure or over the second light-emitting feature, exposing the photoresist layer to a pattern by a reticle, baking and developing the photoresist to form the second pattern. The second pattern can be formed by at least the exposure equipment 350 shown in FIG. 10.

The method 400 continues with operation 470 in which an overlay error is generated. The overlay error can be generated based on the first pattern and the second pattern. In some embodiments, an optical image can be obtained by overlay measurement equipment. In some embodiments, the overlay measurement equipment can include an optical source, an optical sensor, and a light filter. In some embodiments, an optical source can be utilized to emit a light to excite the light-emitting materials of the first light-emitting feature, thereby inducing fluorescence. In some embodiments, an optical sensor can be utilized to receive the fluorescence emitted by the first light-emitting feature and/or second light-emitting feature, thereby generating an optical image. In some embodiments, a light filter can be utilized to select a specific wavelength of a light received by the optical sensor, thereby improving the contrast of the optical image. The overlay error can be determined by the optical image. In this embodiment, the contrast of the profiles of the first pattern, second pattern, and intermediate structure can be improved by emitted fluorescence of the first light-emitting feature and/or second light-emitting feature. Thus, the overlay error can be calculated more accurately. The overlay error can be generated by the exposure equipment 350 shown in FIG. 10.

Figure 12:
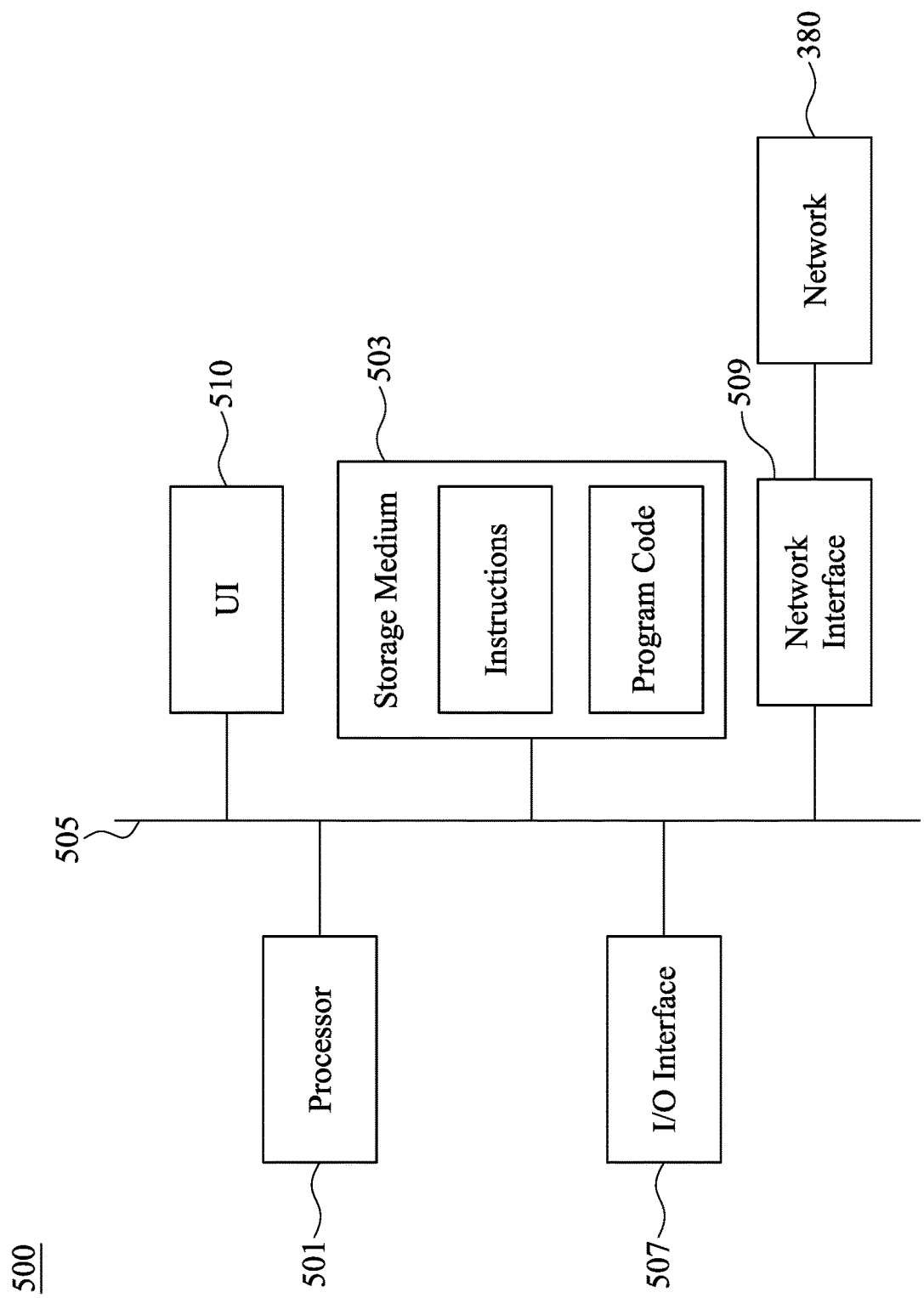
FIG. 12 is a diagram illustrating hardware of a semiconductor fabrication system, in accordance with various aspects of the present disclosure.

The processes illustrated in FIG. 11 may be implemented in the controller 390, or a computing system that organizes the fabrication of a wafer by controlling all or a portion of fabrication equipment in the facility. FIG. 12 is a diagram illustrating hardware of a semiconductor fabrication system 500, in accordance with various aspects of the present disclosure. The system 500 includes one or more hardware processor 501 and a non-transitory computer readable storage medium 503 encoded with, i.e., storing, the program codes (i.e., a set of executable instructions.) The computer readable storage medium 503 may also be encoded with instructions for interfacing with fabrication equipment for producing the semiconductor device. The processor 501 is electrically coupled to the computer readable storage medium 503 via a bus 505. The processor 501 is also electrically coupled to an I/O interface 507 by the bus 505. A network interface 509 is also electrically connected to the processor 501 via the bus 505. The network interface is connected to a network, so that the processor 501 and the computer readable storage medium 503 are capable of connecting to external elements via network 380. The processor 501 is configured to execute the computer program code encoded in the computer readable storage medium 505 in order to cause the system 500 to be usable for performing a portion or all of the operations as described in the methods illustrated in FIG. 11.

In some exemplary embodiments, the processor 501 is, but not limited to, a central processing unit (CPU), a multi-processor, a distributed processing system, an application specific integrated circuit (ASIC), and/or a suitable processing unit. Various circuits or units are within the contemplated scope of the present disclosure.

In some exemplary embodiments, the computer readable storage medium 503 is, but not limited to, an electronic, magnetic, optical, electromagnetic, infrared, and/or a semiconductor system (or apparatus or device). For example, the computer readable storage medium 503 includes a semiconductor or solid-state memory, a magnetic tape, a removable computer diskette, a random access memory (RAM), a read-only memory (ROM), a rigid magnetic disk, and/or an optical disk. In one or more exemplary embodiments using optical disks, the computer readable storage medium 503 also includes a compact disk-read only memory (CD-ROM), a compact disk-read/write (CD-R/W), and/or a digital video disc (DVD).

In some exemplary embodiments, the storage medium 503 stores the computer program code configured to cause system 500 to perform methods illustrated in FIG. 11. In one or more exemplary embodiments, the storage medium 501 also stores information needed for performing the methods illustrated in FIG. 11 as well as information generated during performing the methods and/or a set of executable instructions to perform the operation of methods illustrated in FIG. 11. In some exemplary embodiments, a user interface 510, e.g., a graphical user interface (GUI), may be provided for a user to operate on the system 500.

In some exemplary embodiments, the storage medium 503 stores instructions for interfacing with external machines. The instructions enable processor 501 to generate instructions readable by the external machines to effectively implement the methods illustrated in FIG. 11 during an analysis.

System 500 includes input and output (I/O) interface 507. The I/O interface 507 is coupled to external circuitry. In some exemplary embodiments, the I/O interface 507 can include, but not limited to, a keyboard, keypad, mouse, trackball, track-pad, touch screen, and/or cursor direction keys for communicating information and commands to processor 501.

In some exemplary embodiments, the I/O interface 507 can include a display, such as a cathode ray tube (CRT), liquid crystal display (LCD), a speaker, and so on. For example, the display shows information.

System 500 can also include a network interface 509 coupled to the processor 501. The network interface 509 allows system 500 to communicate with network 380, to which one or more other computer systems are connected. For example, the system 500 may be connected to the fabrication equipment 320-1, . . . , and 320-N, 330, 340-1, . . . , and 340-N, exposure equipment 350, as well as overlay measurement equipment 350 through the network interface 509 connecting to the network 380.

One aspect of the present disclosure provides a semiconductor device structure. The semiconductor device structure includes a substrate, a first light-emitting feature, a first pattern and a second pattern. The first light-emitting feature is disposed on the substrate. The first pattern is disposed on the first light-emitting feature. The second pattern is disposed on the first pattern. The first light-emitting feature is configured to emit a light of a first waveband. The first pattern has a first transmittance to a light of the first waveband. The second pattern has a second transmittance to a light of the first waveband. The first transmittance is different from the second transmittance.

Another aspect of the present disclosure provides a semiconductor device structure. The semiconductor device structure includes a substrate, a first light-emitting feature, and an overlay mark structure. The first light-emitting feature is disposed on the substrate. The first light-emitting feature includes metal ions utilized to emit a fluorescence with a first waveband. The overlay mark structure is disposed on the first light-emitting feature. The overlay mark structure is configured to absorb and/or reflect a fluorescence emitted from the first light-emitting feature.

Another aspect of the present disclosure provides a method for manufacturing a semiconductor device structure. The method includes: providing a substrate; forming a first light-emitting feature on the substrate; forming a first pattern on the first light-emitting feature; and forming a second pattern on the first pattern, wherein the first light-emitting feature is configured to emit a light of a first waveband, and the first pattern has a first transmittance to a light of the first waveband, the second pattern has a second transmittance to a light of the first waveband, and the first transmittance is different from the second transmittance.

The embodiments of the present disclosure provide a semiconductor device including a light-emitting feature. The light emitting feature can be configured to emit fluorescence. The fluorescence can improve the contrast between a current layer and a pre-layer of an overlay mark structure in an optical image. Thus, the overlay error can be calculated more accurately based on the aforesaid optical image.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
a substrate;
a first light-emitting feature disposed on the substrate;
a first pattern disposed on the first light-emitting feature; and
a second pattern disposed on the first pattern,
wherein the first light-emitting feature is configured to emit a light of a first wavelength, and the first pattern has a first transmittance to the light of the first wavelength, the second pattern has a second transmittance to the light of the first wavelength, and the first transmittance is different from the second transmittance;
wherein the first transmittance is smaller than 30%;
wherein a material of the first pattern comprises metal, and the second pattern comprises openings defined by a photosensitive material.

2. The semiconductor device structure of claim 1, wherein the first pattern and the second pattern are collaboratively utilized to serve as an overlay mark.

3. The semiconductor device structure of claim 1, wherein the first transmittance is smaller than the second transmittance.

4. The semiconductor device structure of claim 1, wherein the first light-emitting feature comprises metal ions.

5. The semiconductor device structure of claim 1, wherein the first pattern at least vertically overlaps the second pattern.

6. The semiconductor device structure of claim 1, wherein the first pattern is encapsulated by an intermediate structure, the intermediate structure has a third transmittance to the light of the first wavelength, and the third transmittance is different from the first transmittance and from the second transmittance.

7. The semiconductor device structure of claim 6, wherein the third transmittance ranges between the first transmittance and the second transmittance.

8. A semiconductor device structure, comprising:
a substrate;
a first light-emitting feature disposed on the substrate;
a first pattern disposed on the first light-emitting feature;
a second pattern disposed on the first pattern; and
a second light-emitting feature disposed between the first pattern and the second pattern, wherein the second light-emitting feature is configured to emit a light of a second wavelength different from the first wavelength;
wherein the first light-emitting feature is configured to emit a light of a first wavelength, and the first pattern has a first transmittance to the light of the first wavelength, the second pattern has a second transmittance to the light of the first wavelength, and the first transmittance is different from the second transmittance;
wherein the first transmittance is smaller than 30%.

9. The semiconductor device structure of claim 8, wherein the second pattern has a fourth transmittance to the light of the second wavelength, and the fourth transmittance is smaller than the second transmittance.

10. The semiconductor device structure of claim 8, wherein the second light-emitting feature comprises metal ions.

11. A semiconductor device structure, comprising:
a substrate;
a first light-emitting feature disposed on the substrate, wherein the first light-emitting feature is utilized to emit a fluorescence with a first wavelength;
an overlay mark structure disposed on the first light-emitting feature, wherein the overlay mark structure is configured to absorb or reflect the fluorescence emitted from the first light-emitting feature, wherein the overlay mark structure comprises a first pattern and a second pattern over the first pattern, wherein the first pattern has a first transmittance to the fluorescence of the first wavelength, the second pattern has a second transmittance to the fluorescence of the first wavelength, and the first transmittance is different from the second transmittance; and
a second light-emitting feature disposed between the first pattern and the second pattern, wherein the second light-emitting feature comprises metal ions utilized to emit a fluorescence with a second wavelength different from the first wavelength.

12. The semiconductor device structure of claim 11, wherein the first light-emitting feature comprises metal ions.

13. The semiconductor device structure of claim 11, wherein the first pattern at least vertically overlaps the second pattern.

14. The semiconductor device structure of claim 11, further comprising:
an intermediate structure disposed on the first light-emitting feature, wherein the intermediate structure has a third transmittance to the fluorescence of the first wavelength, and the third transmittance is different from the first transmittance and from the second transmittance.

15. The semiconductor device structure of claim 14, wherein the third transmittance ranges between the first transmittance and the second transmittance.

16. The semiconductor device structure of claim 11, wherein the second pattern has a fourth transmittance to the fluorescence of the second wavelength, and the fourth transmittance is smaller than the second transmittance.

* * * * *